(12) United States Patent
Van Der Schaar et al.

(10) Patent No.: US 7,916,276 B2
(45) Date of Patent: Mar. 29, 2011

(54) LITHOGRAPHIC APPARATUS AND DEVICE MANUFACTURING METHOD WITH DOUBLE EXPOSURE OVERLAY CONTROL

(75) Inventors: Maurits Van Der Schaar, Veldhoven (NL); Richard Johannes Franciscus Van Haren, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/705,050

(22) Filed: Feb. 12, 2010

(65) Prior Publication Data

US 2010/0141916 A1 Jun. 10, 2010

Related U.S. Application Data

(63) Continuation of application No. 11/384,835, filed on Mar. 21, 2006, now Pat. No. 7,687,209.

(51) Int. Cl.
*G03F 7/20* (2006.01)
*H01L 21/027* (2006.01)
(52) U.S. Cl. .............................. 355/53; 355/67; 430/22
(58) Field of Classification Search .................. 355/53, 355/67; 430/22, 30, 312, 313, 314
See application file for complete search history.

(56) References Cited

U.S. PATENT DOCUMENTS

| 5,989,761 A | 11/1999 | Kawakubo et al. |
| 2002/0028528 A1 | 3/2002 | Ohtaka |

FOREIGN PATENT DOCUMENTS

| JP | 09-007919 A | 1/1997 |
| JP | 10-223518 A | 8/1998 |
| JP | 11-307449 A | 11/1999 |
| JP | 2000-021754 A | 1/2000 |
| JP | 2002-100557 A | 4/2002 |
| JP | 2003-209049 A | 7/2003 |

OTHER PUBLICATIONS

Notice of Reasons for Rejection as issued for Japanese Patent Application No. 2007-064287, dated Feb. 8, 2010.

*Primary Examiner* — Christopher G Young
(74) *Attorney, Agent, or Firm* — Pillsbury Winthrop Shaw Pittman LLP

(57) ABSTRACT

A device manufacturing method includes a transfer of a pattern from a patterning device onto a substrate. The device manufacturing method further includes transferring a pattern of a main mark to a base layer for forming an alignment mark; depositing a pattern receiving layer on the base layer; in a first lithographic process, aligning, by using the main mark, a first mask that includes a first pattern and a local mark pattern, and transferring the first pattern and the local mark pattern to the pattern receiving layer; aligning, by using the local mark pattern, a second mask including a second pattern relative to the pattern receiving layer; and
in a second lithographic process, transferring the second pattern to the pattern receiving layer; the first and second patterns being configured to form an assembled pattern.

20 Claims, 3 Drawing Sheets

LITHOGRAPHIC APPARATUS AND DEVICE MANUFACTURING METHOD WITH DOUBLE EXPOSURE OVERLAY CONTROL

The present application is a continuation of U.S. patent application Ser. No. 11/384,835 filed on Mar. 21, 2006, now U.S. Pat. No. 7,687,209, from which benefit is claimed under 35 U.S.C. §120. The entire content of this application is herein fully incorporated by reference.

FIELD OF THE INVENTION

The present invention relates to a lithographic apparatus and a method for manufacturing a device.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Double exposure technology is capable of double patterning, i.e., creating assembled patterns which include a first pattern created in a first exposure and a second pattern created in a second exposure with both exposures being done in a same patterning layer. The assembled pattern is then transferred from the patterning layer to a dielectric layer by some etching technique.

By double exposure technology, features created by the second pattern are interposed with features that were created by the first pattern. Typically, such an assembled pattern may have a resolved critical dimension value below the critical dimension CD for a single exposure as imposed by the optical properties of the lithographic apparatus.

In double exposure technology, the overlay requirements for the first and second exposures are typically in the order of CD/20, which is substantially dictated by the positioning of the second exposure in relation to the first exposure.

Usually the alignment of the first and second exposures is done using the same mark which is defined below the patterning layer. This patterning layer may be a so-called hard mask layer, which occasionally can be opaque, so that then the alignment is done on residual topology on top of the hard mask. This residual topography might yield weak signals which could affect overlay control. Moreover, alignment of both first and second exposures with the same mark below the patterning layer, may result in the introduction of two times the same position measurement error, which may strongly reduce the precision of the alignment.

SUMMARY OF THE INVENTION

It is desirable to have a lithographic apparatus which is capable of improving double exposure technology by a relaxation of the overlay requirements.

The present invention relates to a device manufacturing method including transferring a pattern from a patterning device onto a substrate, wherein the device manufacturing method further includes transferring a pattern of a main mark to a base layer for forming an alignment mark; depositing a pattern receiving layer on the base layer; aligning, by using the main mark, a first mask that includes a first pattern and a local mark pattern and transferring the first pattern and the local mark pattern to the pattern receiving layer; aligning, by using the local mark pattern, a second mask that includes a second pattern, relative to the pattern receiving layer; and transferring the second pattern to the pattern receiving layer; the first and second patterns being configured to form an assembled pattern.

Also, it is desirable to have a device manufacturing method which improves double exposure technology by a relaxation of the overlay requirements.

The present invention relates to a lithographic apparatus configured to project a pattern from a patterning device onto a substrate wherein the lithographic apparatus is further configured to: project a pattern of a main mark on a base layer for forming an alignment mark; align, after creating the main mark on the base layer, and after provision of a pattern receiving layer and a resist layer, a first mask that includes a first pattern and a local mark pattern by using the main mark; project in a first exposure the first pattern and the local mark pattern on the resist layer;
transfer the first pattern and the local mark pattern to the pattern receiving layer; provide a further resist layer on top of the pattern receiving layer; align a second mask that includes a second pattern relative to the pattern receiving layer by using the local mark pattern; project in a second exposure, the second pattern on the further resist layer; the first and second patterns being configured to form an assembled pattern.

Moreover, the present invention relates to a device manufactured by a device manufacturing method including transferring a pattern from a patterning device onto a substrate; the device manufacturing method further including transferring a pattern of a main mark to a base layer for forming an alignment mark; depositing a pattern receiving layer on the base layer;
aligning by using the main mark, a first mask that includes a first pattern and a local mark pattern and transferring the first pattern and the local mark pattern to the pattern receiving layer;
aligning by using the local mark pattern, a second mask that includes a second pattern, relative to the pattern receiving layer; and transferring the second pattern to the pattern receiving layer, the first and second patterns, each having a minimal pitch, being configured to form an assembled pattern on the device, wherein the assembled pattern on the device has a minimal pitch of features of about half of the minimal pitch of the first and second pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
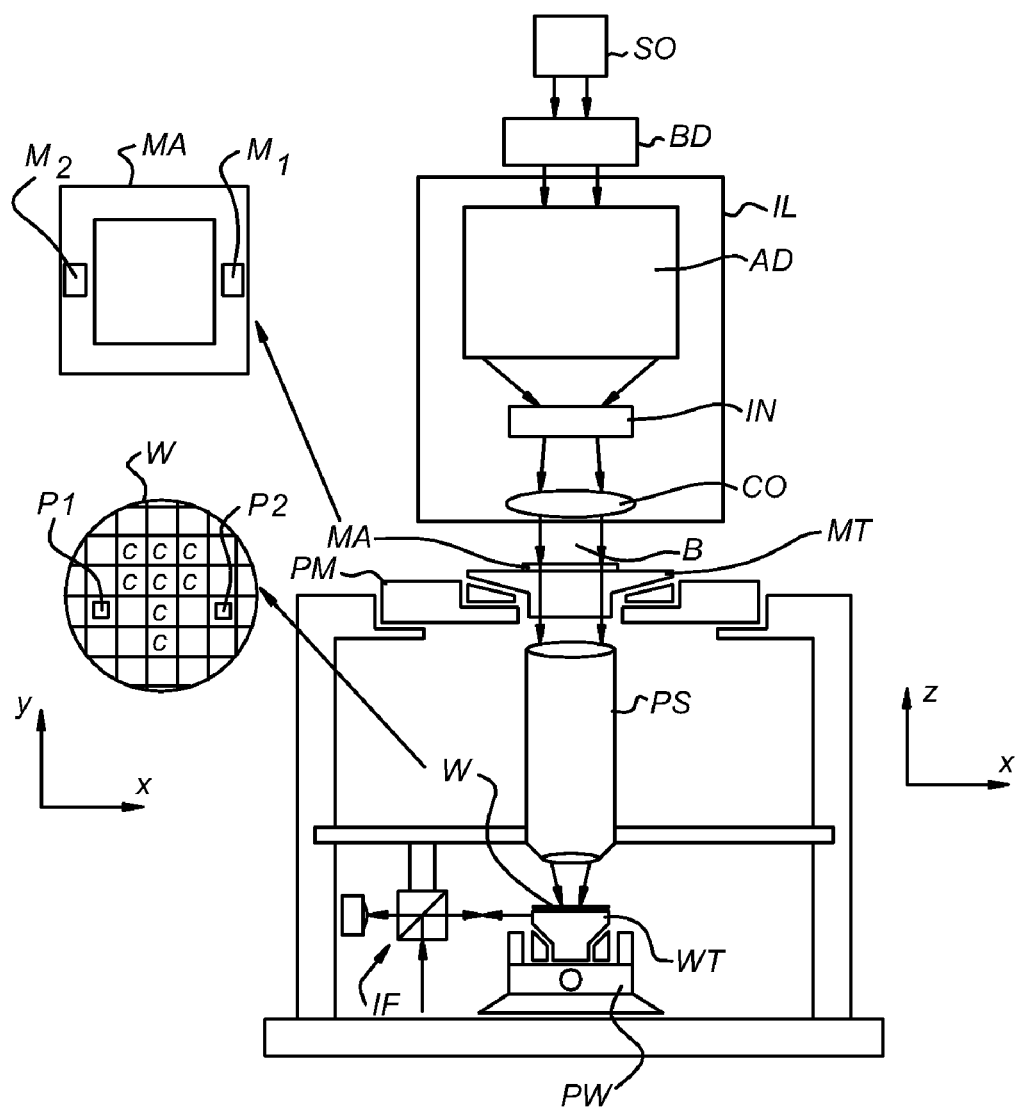
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An embodiment of the method according to the present invention is illustrated below with reference to FIGS. 2-4.

Figure 2:
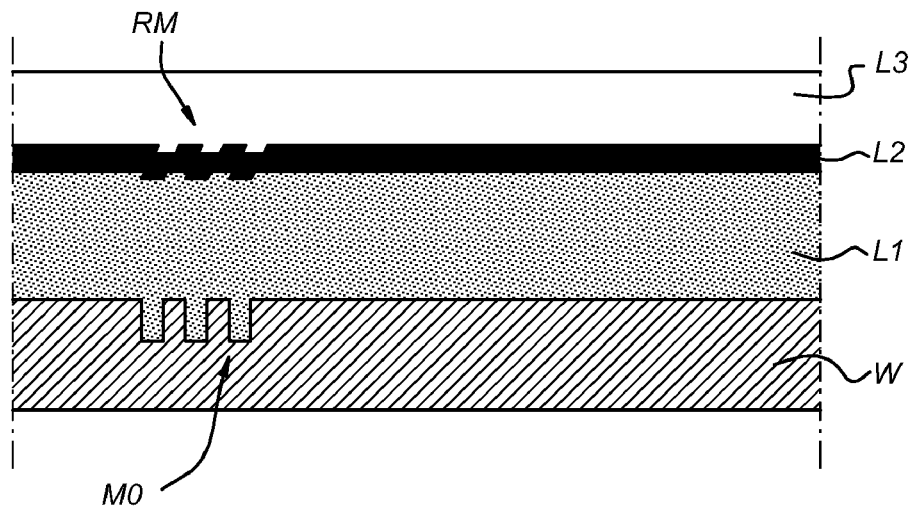
FIG. 2 depicts a substrate including a pattern receiving layer.

FIG. 2 schematically shows a substrate W including a pattern receiving layer. On the substrate W, which may be a semiconductor substrate, a dielectric layer L1 is deposited. On top of the dielectric layer L1 a pattern receiving layer L2 is deposited. The pattern receiving layer L2 is a layer configured for receiving an assembled pattern composed of a first pattern generated in a first exposure and a second pattern generated in a second exposure. Typically, the pattern receiving layer L2 will be a dielectric layer such as a hard mask layer. On top of the pattern receiving layer L2 a resist layer L3 is deposited.

The substrate W includes a main mark M0 which may be a substrate alignment mark. A phenomenon known as residual topography causes a remnant mark RM of the main mark M0 to be present in the patterning receiving layer L2. The remnant mark RM may be used for alignment of a mask which holds a pattern to be created in layer L2.

Using the alignment on the remnant mark RM, a first exposure of a first mask that contains a first pattern is carried out by the lithographic apparatus. After the first exposure, the resist layer L3 is developed to create the first pattern in that layer L3. Next, the first pattern is transferred to the pattern receiving layer L2. The resist layer L3 is removed. The lithographic processing required can be done in any known way.

In FIG. 2, the main mark M0 is located in the substrate W (or the zero layer). It should be appreciated that the main mark M0 may also be located in any base layer W; L1 below the pattern receiving layer L2. The base layer may be the substrate or a layer deposited on the substrate. Such a base layer may neighb the pattern receiving layer L2.

Additionally, it should be appreciated the dielectric layer L1 may also be a stack including two or more (sub)layers. Also, these (sub)layers may include other materials than dielectric materials.

Figure 3:
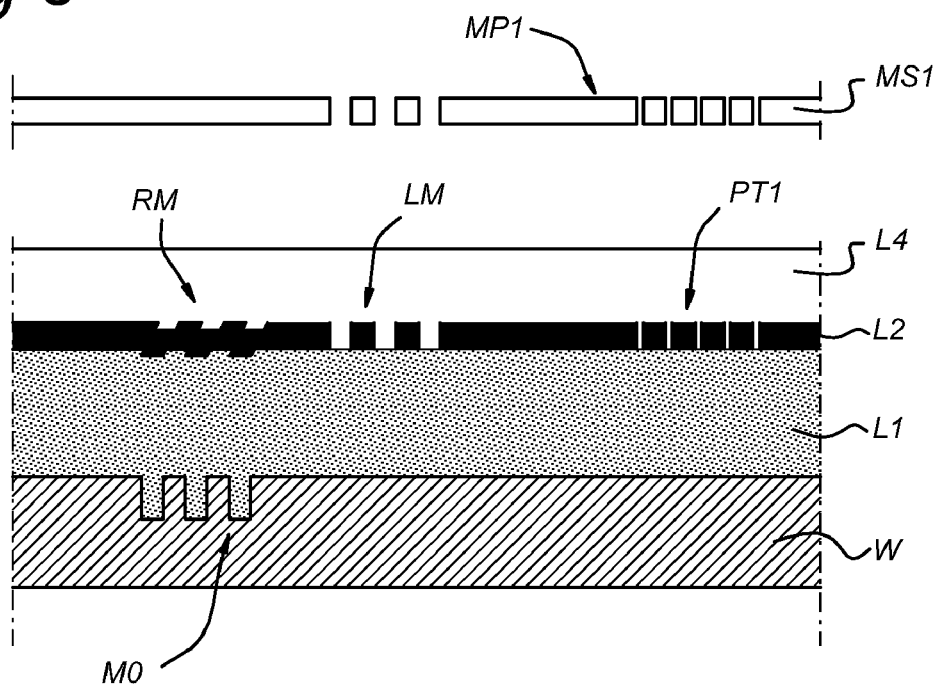
FIG. 3 depicts the substrate including the pattern receiving layer after a first exposure of a first pattern portion.

FIG. 3 schematically shows the substrate including the patterning layer after the first exposure of the first pattern. In FIG. 3 entities with the same reference number refer to identical entities as shown in the preceding figures.

During the first exposure, the mask pattern MP1 of the first mask MS1 is imaged on the pattern receiving layer L2. The mask pattern MP1 of the first mask MS1 includes a pattern for creating in the pattern receiving layer L2 the first pattern PT1 and a local mark LM, simultaneously with the first pattern PT1. Thus, after transfer, the pattern receiving layer L2 includes the remnant mark RM, the first pattern PT1 and the local mark LM. Since the first pattern PT1 and the local mark LM are created during the same first exposure, the alignment of both the local mark LM and the first pattern PT1 is the same.

On top of the pattern receiving layer L2 a further resist layer L4 is deposited.

Figure 4:
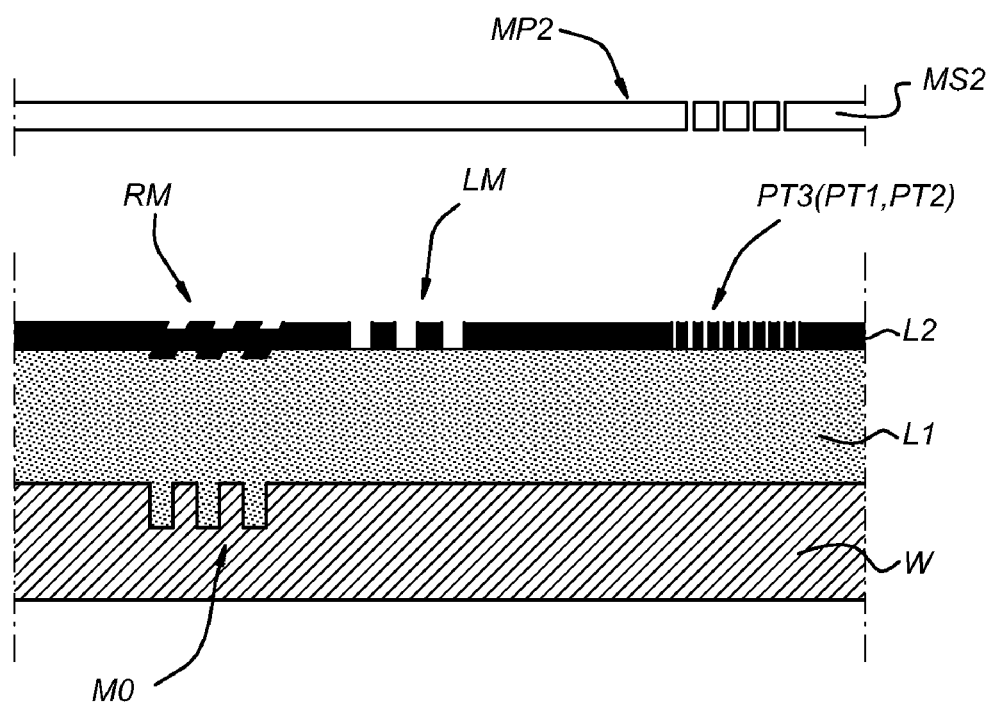
FIG. 4 depicts the substrate including the pattern receiving layer after a second exposure of a second pattern portion.

FIG. 4 schematically shows the substrate including the patterning layer after a second exposure of a second pattern.

In the present invention, it is recognized that alignment of a second mask pattern MP2 on the second mask MS2 which is to create a second pattern PT2 in the pattern receiving layer L2 during the second exposure, is improved when the alignment of the second mask MS2 is carried out relative to the local mark LM.

The remnant mark RM may suffer from distortions brought about by the layer L1. In contrast, the local mark LM does not suffer from any distortions caused by the layer L1 and (from the viewpoint of alignment) is better defined than the main mark M0 on the substrate W. By aligning the second mask pattern MP2 on the second mask MS2 with the local mark LM the alignment error of the second pattern in relation to the first pattern is relatively small.

The lithographic apparatus is thus configured to carry out an alignment procedure using the local mark LM instead of the remnant mark RM (or if still detectable the main mark M0) to align the second mask pattern MP2 of the second mask MS2 with the first pattern PT1 on the substrate W. After proper alignment, the lithographic apparatus carries out a second exposure of the further resist layer L4 by the second mask MS2 which contains the second pattern.

After the second exposure, the further resist layer L4 is developed to create the second pattern PT2 in that further resist layer L4. Next, the second pattern PT2 is transferred to the pattern receiving layer L2. The further resist layer L4 is removed. As noted above, lithographic processing as required can be done in any known way.

By lithographic processing the assembled pattern PT3 in the pattern receiving layer L2 has been formed, which assembled pattern PT3 includes the first pattern PT1 and the second pattern PT2, superimposed on each other.

As mentioned above, each one of the first and second patterns PT1, PT2 has a critical dimension limit CD as imposed by the optical properties of the lithographic apparatus. By properly aligned superimposition of the first and second patterns PT1, PT2, the assembled pattern PT3 may have a resolved critical dimension value below the critical dimension limit CD for each one of the first and second patterns PT1, PT2 separately. By consequence the assembled pattern PT3 may have a higher density of features than each one of the first and second patterns PT1, PT2, individually.

Moreover, since the second pattern PT2 is aligned with respect to the first pattern PT1 by using the local mark pattern LM that was created at the same time as the first pattern PT1, the overlay error of the first and second patterns is reduced by the method of the present invention in comparison to a method where alignment of the second pattern would be done on the main mark M0.

The assembled pattern PT3 may have a minimal pitch of features (e.g., lines) of about half of the minimal pitch of the first and second patterns. For example, the minimal pitch of features in the first pattern PT1 and in the second pattern PT2 may be about 90 nm or less. The assembled pattern PT3 may thus have a minimal pitch of, on average, 45 nm or less.

Due to the superimposition of the second and first pattern, the pitch of the assembled pattern PT3 may show a slight variation of the minimal pitch across the assembled pattern.

After defining the assembled pattern in the pattern receiving layer L2, the assembled pattern PT3 is transferred to the dielectric layer L1 below.

The pattern receiving layer L2 may be a hard mask layer. It may consist of amorphous carbon, silicon nitride or poly-silicon. The pattern receiving layer L2 may have a thickness between 25 and 100 nm.

It is noted that the method of the present invention can be applied not only on a dielectric layer L1 deposited directly over the substrate W layer, but may also be used in cases where one or more additional layers below the dielectric layer L1 are present that were created previously.

A method according to the present invention may include at least some of the following actions: providing a substrate W; creating a main mark M0 on a base layer as an alignment mark; depositing a pattern receiving layer L2; providing a resist layer L3 on top of the pattern receiving layer L2; aligning a first mask including a first pattern PT1 and a local mark pattern LM by using the main mark M0; in a first exposure projecting on the resist layer L3 the first pattern PT1 and local mark pattern LM; developing the exposed resist layer L3, and transferring the first pattern PT1 and the local mark pattern LM to the pattern receiving layer L2; providing a further resist layer L4 on top of the pattern receiving layer L2; aligning a second mask including a second pattern PT2 on the pattern receiving layer L2 by using the local mark pattern LM; in a second exposure projecting on the resist layer L4 the second pattern PT2, and developing the exposed further resist layer L4, and transferring the second pattern PT2 to the pattern receiving layer L2.

An assembled pattern PT3 is formed that includes the first and second pattern PT1, PT2.

Each of the first and second patterns PT1, PT2 typically has a minimal pitch. According to the present invention, the assembled pattern on the device may have a minimal pitch of features of about half of the minimal pitch of the first and second pattern.

According to the present invention, a lithographic apparatus may be configured for projecting a pattern of a main mark M0 on a base layer for forming an alignment mark; aligning, after creating the main mark on the substrate or the layer deposited thereon, and after provision of a pattern receiving layer L2 and resist layer L3, a first mask which includes a first pattern PT1 and a local mark pattern LM on the base layer by using the main mark M0; in a first exposure projecting on the resist layer L3 the first pattern PT1 and local mark pattern LM; after transfer of the first pattern PT1 and the local mark pattern LM to a pattern receiving layer L2 and after provision of a further resist layer L4 on top of the pattern receiving layer L2, aligning a second mask including a second pattern PT2 on the pattern receiving layer L2 by using the local mark pattern LM; in a second exposure projecting on the further resist layer L4 the second pattern PT2.

Accordingly, an assembled pattern PT3 is formed that includes the first and second pattern PT1, PT2.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus configured to project a pattern from a patterning device onto a substrate, wherein the lithographic apparatus is further configured to:
   align a first mask that comprises a first pattern and a local mark pattern by using a main mark of a base layer of the substrate located under a pattern receiving layer of the substrate;
   project, in a first exposure, the first pattern and the local mark pattern on a resist layer over the main mark and the pattern receiving layer;
   align a second mask that comprises a second pattern relative to the pattern receiving layer by using the local mark pattern transferred into the pattern receiving layer; and
   project, in a second exposure, the second pattern on a further resist layer on top of the pattern receiving layer, the first and second patterns being configured to form an assembled pattern.

2. An apparatus according to claim 1, wherein the base layer is the substrate.

3. An apparatus according to claim 1, wherein the pattern receiving layer is a hard mask layer.

4. An apparatus according to claim 1, wherein the assembled pattern has a minimal pitch of features of about half a minimal pitch of the first and/or second pattern.

5. An apparatus according to claim 1, wherein the assembled pattern has a minimal pitch of features which varies around an average value of half a minimal pitch of the first and/or second pattern.

6. An apparatus according to claim 1, wherein the assembled pattern has a minimal pitch of features of about 45 nm or less.

7. A lithographic system to transfer a pattern from a patterning device onto a substrate, wherein the lithographic system is further configured to:
   align a first mask that comprises a first pattern and a local mark pattern by using a main mark of the substrate underneath a resist layer on the substrate, the resist layer overlying a pattern receiving layer of the substrate;
   project, in a first exposure, the first pattern and the local mark pattern on the resist layer;
   align a second mask that comprises a second pattern relative to the pattern receiving layer by using the local mark pattern transferred to the pattern receiving layer; and
   project, in a second exposure, the second pattern on a further resist layer on top of the pattern receiving layer, the first and second patterns being configured to form an assembled pattern.

8. An apparatus according to claim 7, wherein the main mark is on or part of a base layer of the substrate located under the pattern receiving layer.

9. An apparatus according to claim 8, wherein the base layer is the substrate.

10. An apparatus according to claim 7, further configured to transfer the first pattern and the local mark pattern to the pattern receiving layer.

11. An apparatus according to claim 7, wherein the pattern receiving layer is a hard mask layer.

12. An apparatus according to claim 7, wherein the assembled pattern has a minimal pitch of features of about 45 nm or less.

13. An apparatus according to claim 7, wherein the assembled pattern has a minimal pitch of features which varies around an average value of half a minimal pitch of the first and/or second pattern.

14. An apparatus according to claim 7, further configured project a pattern of the main mark on the substrate.

15. A lithographic apparatus configured to project a pattern from a patterning device onto a substrate, wherein the lithographic apparatus is further configured to:
   align a first pattern and a local mark pattern of a patterning device by using a main mark of the substrate located under a resist layer on the substrate;
   project, in a first exposure, the first pattern and the local mark pattern on the resist layer;
   align a second pattern of a patterning device relative to a pattern receiving layer of the substrate by using the local mark pattern transferred into the pattern receiving layer; and
   project, in a second exposure, the second pattern on a further resist layer on top of the pattern receiving layer, the first and second patterns being configured to form an assembled pattern.

16. An apparatus according to claim 15, further configured project a pattern of the main mark on the substrate.

17. An apparatus according to claim 15, further configured to transfer the first pattern and the local mark pattern to the pattern receiving layer.

18. An apparatus according to claim 15, wherein the assembled pattern has a minimal pitch of features of about 45 nm or less.

19. An apparatus according to claim 15, wherein the main mark is on or part of a base layer of the substrate located under the pattern receiving layer.

20. An apparatus according to claim 15, wherein the assembled pattern has a minimal pitch of features which varies around an average value of half a minimal pitch of the first and/or second pattern.

* * * * *